US011140779B2

(12) United States Patent
Campbell et al.

(10) Patent No.: US 11,140,779 B2
(45) Date of Patent: Oct. 5, 2021

(54) LAMINATE MATERIALS WITH EMBEDDED HEAT-GENERATING MULTI-COMPARTMENT MICROCAPSULES

(71) Applicant: International Business Machines Corporation, Armonk, NY (US)

(72) Inventors: Eric J. Campbell, Rochester, MN (US); Joseph Kuczynski, North Port, FL (US); Timothy J. Tofil, Rochester, MN (US)

(73) Assignee: International Business Machines Corporation, Armonk, NY (US)

( * ) Notice: Subject to any disclaimer, the term of this patent is extended or adjusted under 35 U.S.C. 154(b) by 4 days.

(21) Appl. No.: 16/358,315

(22) Filed: Mar. 19, 2019

(65) Prior Publication Data

US 2019/0215956 A1 Jul. 11, 2019

Related U.S. Application Data

(62) Division of application No. 15/247,151, filed on Aug. 25, 2016, now Pat. No. 10,278,284.

(51) Int. Cl.
*B29C 35/02* (2006.01)
*H05K 1/03* (2006.01)
*H05K 1/02* (2006.01)
*B29K 105/08* (2006.01)
*B29K 105/16* (2006.01)
*B29L 31/34* (2006.01)

(52) U.S. Cl.
CPC ........... *H05K 1/0353* (2013.01); *B29C 35/02* (2013.01); *B29C 35/0272* (2013.01); *H05K 1/0201* (2013.01); *B29K 2105/0872* (2013.01); *B29K 2105/162* (2013.01); *B29K 2995/0008* (2013.01); *B29L 2031/3425* (2013.01); *H05K 1/0366* (2013.01); *H05K 2201/068* (2013.01); *H05K 2201/09009* (2013.01)

(58) Field of Classification Search
CPC ................ B29C 35/02; B29C 35/0272; H05K 1/0201; H05K 1/0353; H05K 1/0366; H05K 2201/068; H05K 2201/09009; B29K 2105/0872; B29K 2105/162; B29K 2995/0008; B29L 2031/3425
See application file for complete search history.

(56) References Cited

U.S. PATENT DOCUMENTS

| | | |
|---|---|---|
| 3,585,982 A | 6/1971 | Hollinshead |
| 3,653,372 A | 4/1972 | Douglas |
| 4,095,583 A | 6/1978 | Petersen et al. |
| 5,589,523 A | 12/1996 | Sawaoka et al. |
| 5,904,796 A | 5/1999 | Freuler et al. |
| 5,984,995 A | 11/1999 | White |
| 6,114,413 A | 9/2000 | Kang et al. |
| 6,365,319 B1 | 4/2002 | Heath et al. |
| 6,947,285 B2 | 9/2005 | Chen et al. |
| 7,290,549 B2 | 11/2007 | Banerjee et al. |
| 7,816,785 B2 | 10/2010 | Iruvanti et al. |
| 7,834,442 B2 | 11/2010 | Furman et al. |
| 7,886,813 B2 | 2/2011 | Hua et al. |
| 7,923,488 B2 | 4/2011 | Xu |
| 8,174,112 B1 | 5/2012 | Karp et al. |
| 8,741,804 B2 | 6/2014 | Boday et al. |
| 8,865,030 B2 | 10/2014 | Koplin et al. |
| 8,896,110 B2 | 11/2014 | Hu et al. |
| 9,186,641 B2 | 11/2015 | Boday et al. |
| 9,307,692 B2 | 4/2016 | Boday et al. |
| 9,307,693 B2 | 4/2016 | Boday et al. |
| 9,313,946 B2 | 4/2016 | Boday et al. |
| 9,434,133 B2 | 9/2016 | Boday et al. |
| 9,694,337 B2 | 7/2017 | Boday et al. |
| 9,856,404 B2 | 1/2018 | Campbell et al. |
| 9,896,389 B2 | 2/2018 | Campbell et al. |
| 9,926,471 B2 | 3/2018 | Campbell et al. |
| 10,072,185 B2 | 9/2018 | Campbell et al. |
| 10,309,692 B2 | 6/2019 | Campbell et al. |
| 2004/0007784 A1 | 1/2004 | Skipor et al. |
| 2005/0041406 A1 | 2/2005 | Matayabas et al. |
| 2006/0079021 A1 | 4/2006 | Yang |
| 2006/0228542 A1 | 10/2006 | Czubarow |

(Continued)

FOREIGN PATENT DOCUMENTS

| | | |
|---|---|---|
| CA | 918331 A | 1/1973 |
| CN | 103740978 A | 4/2014 |
| CN | 103740997 A | 4/2014 |
| CN | 108070134 A | 5/2018 |

(Continued)

OTHER PUBLICATIONS

Yamaura et al., "Preparation and characterization of (3-aminopropyl) triethoxysilane-coated magnetite nanoparticles," Journal of Magnetism and MagneticMaterials, vol. 279, 2004, pp. 210-217.
Kreft et al., "Shell-in-Shell Microcapsules: A Novel Tool for Integrated, Spatially Confined Enzymatic Reactions", Angewandte Chemie International Edition, vol. 46, 2007, pp. 5605-5608.
Xiong et al., "Towards Theranostic Multicompartment Microcapsules: in-situ Diagnostics and Laser-induced Treatment", Theranostics, vol. 3, Issue 3, 2013, pp. 141-151.
Marzzacco, C., "The Effect of a Change in the Catalyst on the Enthalpy of Decomposition of Hydrogen Peroxide," pp. 12-13, Chem 13 News/Nov. 2008, reprinted from pp. 16-17, May 2001.

(Continued)

*Primary Examiner* — Irina S Zemel
(74) *Attorney, Agent, or Firm* — Patterson + Sheridan, LLP

(57) ABSTRACT

A composite material incorporates multi-compartment microcapsules that produce heat when subject to a stimulus such as a compressive force or a magnetic field. The stimulus ruptures an isolating structure within the multi-compartment microcapsule, allowing reactants within the multi-compartment microcapsule to produce heat from an exothermic reaction. In some embodiments, the composite material is a laminate used in the manufacture of multi-layer printed circuit boards (PCBs) and provides heat during the curing process of the multi-layer PCBs to ensure a consistent thermal gradient in the multi-layer product.

20 Claims, 6 Drawing Sheets

(56) References Cited

U.S. PATENT DOCUMENTS

| | | |
|---|---|---|
| 2008/0038540 A1 | 2/2008 | Hirayama et al. |
| 2009/0181254 A1 | 7/2009 | White et al. |
| 2011/0266549 A1 | 11/2011 | Onodera et al. |
| 2013/0034739 A1 | 2/2013 | Boday et al. |
| 2014/0110049 A1 | 4/2014 | Yuen et al. |
| 2014/0368992 A1 | 12/2014 | Strader et al. |
| 2017/0129825 A1 | 5/2017 | Campbell |
| 2017/0130102 A1 | 5/2017 | Campbell |
| 2017/0130993 A1 | 5/2017 | Campbell et al. |
| 2018/0016474 A1 | 1/2018 | Campbell |
| 2018/0063949 A1 | 3/2018 | Campbell |
| 2018/0066164 A1 | 3/2018 | Campbell |

FOREIGN PATENT DOCUMENTS

| | | | |
|---|---|---|---|
| JP | 2000317578 A | | 11/2000 |
| JP | 2001176924 A | | 6/2001 |
| JP | 4073571 B2 | | 4/2008 |
| TW | 200425250 A | | 11/2004 |
| WO | 2009029804 A2 | | 3/2009 |
| WO | 2011086018 A1 | | 7/2011 |
| WO | 2014204828 A2 | | 12/2014 |

OTHER PUBLICATIONS

Masin, G., "The Chemistry of Hand Warmers", 3 pages, printed from <http://www.chemistryislife.com/the-chemistry-of-hand-warmer> on Sep. 14, 2015.

Unknown, "Flameless Chemical Heaters", 2014, zenstoves.net, 4 pages, printed from <http://zenstoves.net/Flameless.htm> on Sep. 14, 2015.

Kawashita et al., "In vitro heat generation by ferrimagnetic maghemite microspheres for hyperthermic treatment of cancer under alternating magnetic field.", Journal of Materials Science: Materials in Medicine, vol. 19, Issue 5, 2008, 1897-1903(Abstract Only, 2 pages), printed from <http://www.ncbi.nlm.nih.gov/pubmed/17914614> on Sep. 14, 2015.

Unknown, "Standard enthalpy change of formation (data table)", Wikipedia, the free encyclopedia, 2015, 12 pages, printed from <https://en.wikipedia.org/wiki/Standard.sub.-enthalpy.sub.--change.su-b.--of.sub.-formation.sub.--%28data.sub.--table%29> on Sep. 14, 2015.

Unknown, "Thermochemistry", 7 pages, downloaded from <http://smd.gytool.cz/downloads/thermochemistry.sub.--bar.pdf> on Sep. 14, 2015.

Delcea et al., "Multicompartmental Micro- and Nanocapsules: Hierarchy and Applications in Biosciences", Macromolecular Bioscience, vol. 10, 2010, pp. 465-474.

Keller et al., "Mechanical Properties of Microcapsules Used in a Self-Healing Polymer", Experimental Mechanics, vol. 46, 2006, pp. 725-733.

Hu et al., "Controlled Rupture of Magnetic Polyelectrolyte Microcapsules for Drug Delivery", Langmuir, vol. 24, 2008, pp. 11811-11818.

Stober et al., "Controlled Growth of Monodisperse Silica Spheres in the Micron Size Range," Journal of Colloid and Interface Science 26, pp. 62-69 (1968).

Unknown, "PTFE Coatings," Specific Heat of Some Common Substances, http://www.engineeringtoolbox.com/specific-heat-capacity-d.sub.--391.html-, printed Jun. 23, 2015. 11:08 AM, 7 pgs.

Unknown, "Advanced Technologies for LCD Assembly", Dow Corning Corporation, 2014, 4 pages, downloaded from <http://www.dowcorning.com/content/publishedlit/11-3437.sub.--Advanced.-sub.-Technologies.sub.-LCD.sub.--Assembly.pdf?wt.svl=ELEC.sub.--LHH> on Oct. 23, 2015.

Unknown, "Technical Overview: Microencapsulation", microtek laboratories, inc., 4 pages, downloaded from <http://www.microteklabs.com/technical_overview.pdf> on Sep. 14, 2015.

Electrical Engineering Stack Exchange, "Is it Proper to Use an Internal Layer as a Heat Bed if I Want to Warm my Multilayer PCB", 2016, 3 pages.

Unknown, "Loctite Eccobond DS 6601", Henkel Corporation, 2013, 2 pages, downloaded from <https://tds.us.henkel.com/NA/UT/HNAUTTDS.nsf/web/C0DD8377AB27D6398525-71341005DC4A1/$File/LOCTITE%20ECCOBOND%20DS%206601-EN.pdf> on Oct. 27, 2015.

Brown et al., "In situ poly(urea-formaldehyde) microencapsulation of dicyclopentadiene", Journal of Microencapsulation, Nov.-Dec. 2003, vol. 20, No. 6, pp. 719-730.

Unknown, "Materials for Sealing Liquid Crystal", Three Bond Technical News, Three Bond Co., Ltd., vol. 43, Issued May 1, 1994, pp. 1-8.

IBM, "List of IBM Patents or Patent Applications Treated as Related," for U.S. Appl. No. 16/358,315, filed Mar. 19, 2019, 2 pages.

LAMINATE MATERIALS WITH EMBEDDED HEAT-GENERATING MULTI-COMPARTMENT MICROCAPSULES

I. CROSS-REFERENCE TO RELATED APPLICATIONS

This application is a divisional of U.S. patent application Ser. No. 15/247,151, filed Aug. 25, 2016. The aforementioned related patent application is herein incorporated by reference in its entirety.

II. FIELD OF THE DISCLOSURE

The present disclosure relates generally to laminate materials that include heat-generating, multi-compartment microcapsules.

III. BACKGROUND

During conventional lamination of a multi-layer printed circuit board (PCB), a thermal gradient develops between top and bottom platens of a lamination press and within the interior of the PCB stack. Depending on the thickness of the PCB stack, the thermal gradient can result in internal (e.g., middle) laminate layers having a different degree of cure than the outer layers. Different degrees of cure can result in different glass transition temperatures, differences in the coefficient of thermal expansion of the laminate material, and other undesirable properties that may reduce reliability and structural integrity of the multi-layer PCB.

IV. SUMMARY OF THE DISCLOSURE

According to an embodiment, a laminate material includes heat-generating multi-compartment microcapsules. A multi-compartment microcapsule includes at least two compartments. Each compartment contains a reactant. The reactants produce heat when they are combined. An isolating structure separates the compartments of the multi-compartment microcapsule. The isolating structure is configured to rupture in response to a stimulus. In some embodiments, the multi-compartment microcapsules are shell-in-shell multi-compartment microcapsules having an inner shell contained within an outer shell. The inner shell and the outer shell contain the heat-generating reactants.

According to an illustrative embodiment, the reactants are allowed to mix upon rupture of the inner shell, while the outer shell remains intact. The reactants produce heat while the laminate material cures. In some embodiments, the stimulus that ruptures the isolating structure is a compressive force or a magnetic field. In an embodiment where the stimulus is a magnetic field, the inner shell of the microcapsule may contain magnetic nanoparticles, such as magnetite ($Fe_3O_4$) particles, that rotate and/or vibrate at an accelerated rate upon the application of a magnetic field thereby rupturing the inner shell. Since the outer shell of the microcapsule in this embodiment has no embedded magnetic nanoparticles, the outer shell remains intact upon the application of the magnetic field.

According to an illustrative embodiment, a method includes applying heat to a composite material that includes a multi-compartment microcapsule. The multi-compartment microcapsule includes a first compartment that contains a first reactant and a second compartment that contains a second reactant. The second compartment may be separated from the first compartment by an isolating structure. In such a case, the first compartment is configured to remain intact in response to a stimulus that ruptures the isolating structure between the first compartment and the second compartment. The method further includes, while applying heat, applying a stimulus to rupture the isolating structure to generate heat due to the exothermic reaction of the first reactant and the second reactant.

V. BRIEF DESCRIPTION OF THE DRAWINGS

VI. DETAILED DESCRIPTION

The present disclosure relates to composite materials that incorporate multi-compartment microcapsules dispersed within a laminate material. Composite materials include sealants, adhesives, epoxies, thermal interface materials, coatings, paints, varnishes, and encapsulants.

The present disclosure describes a process for activating heat-generating multi-compartment microcapsules by applying a stimulus of sufficient magnitude to rupture an isolating structure that separates compartments of the multi-compartment microcapsules. Generally, an inner structure ruptures while an outer shell remains intact so that the reactants and the reaction products do not contact the laminate material. Examples of a stimulus includes application of a compressive force, a magnetic field, or heat to raise the temperature of the multi-compartment microcapsules.

The present disclosure also describes a process for curing a laminate material with the use of embedded multi-compartment microcapsules included in the laminate material. A stimulus of sufficient magnitude is applied to the laminate material that ruptures an isolating structure separating the compartments of the multi-compartment microcapsules. The contents of the compartments react exothermically thereby supplying heat within the laminate material itself.

Including heat-generating multi-compartment microcapsules in laminate materials provides several benefits. One benefit is a reduction in curing time. In curing, a laminate must reach a pre-determined curing temperature. Multi-compartment microcapsules generate heat within the laminate. Curing time is reduced because the heat within the laminate is in addition to heat provided from an external heat source. Providing heat only from an external source requires time to transfer from the external source into the laminate material.

Another benefit is a more even cure. Use of heat-generating multi-compartment microcapsules in the laminate material evens out a thermal gradient that develops in the laminate as heat from an external source is applied to the laminate. The heat-generating microcapsules raises the temperature from within the laminate while heat is applied from the outside layers. A more uniform thermal gradient is the result. A thermal gradient is a measure of temperature differences between temperatures at various points in the laminate. A thermal gradient may be monitored over time. A more uniform thermal gradient yields smaller temperature differences at any instant in time due to the internally released heat from the microcapsules.

Another benefit of the additional heat from the microcapsules is decreased viscosity of the laminate material. Viscosity is the resistance of a material to flow. If the laminate material is an adhesive, decreasing the viscosity may provide better control over a bond line thickness of the adhesive applied between two substrates.

Figure 1:
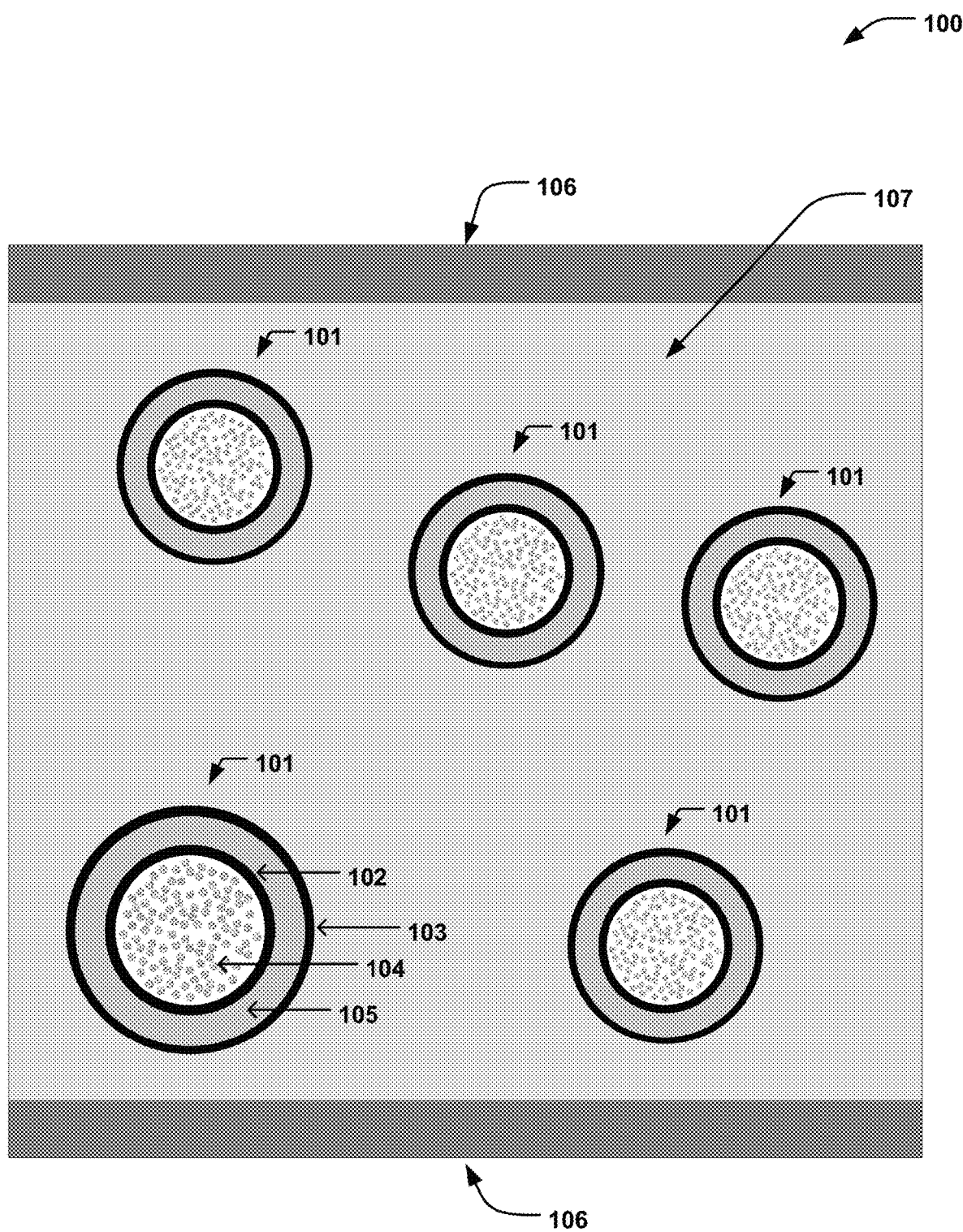
FIG. 1 depicts an embodiment of a portion of a printed circuit board (PCB) that includes a composite material sandwiched between conductive material, the composite material includes multi-compartment microcapsules.

FIG. 1 depicts a cut-away view of an embodiment of a portion of a printed circuit board 100 that includes layers of a conductive material 106, such as copper, separated by a composite material 107. The composite material 107 contains multi-compartment microcapsules 101. The composite material 107 may include a pre-preg material, an epoxy resin, an adhesive, or a combination thereof. The composite material 107 may also include reinforcing fibers, such as glass fibers.

As illustrated in FIG. 1, the multi-compartment microcapsules 101 have a shell-in-shell configuration. The microcapsules 101 include an inner shell 102 contained within an outer shell 103. The inner shell 102 functions as an isolating structure that ruptures in response to a stimulus. The inner shell 102 forms a first compartment that contains a first reactant 104. The volume between the inner shell 102 and the outer shell 103 forms a second compartment. The second compartment contains a second reactant 105. The first and second reactants 104, 105 undergo an exothermic chemical reaction when mixed together. While the inner shell 102 of the multi-compartment microcapsule 101 is intact (e.g., not ruptured), the inner shell 102 prevents the first reactant 104 from contacting the second reactant 105. The inner shell 102 of the multi-compartment microcapsule 101 is configured to rupture when subjected to a particular stimulus such as a physical force or a magnetic field.

In some embodiments, the multi-compartment microcapsules have a characteristic dimension (e.g., a diameter) of 5.0 microns (μm) or less. For example, the characteristic dimension for the outer shell 103 is less than 55, 40, 30, 20, 10, 5, 2, 1, 0.5 and 0.2 μm. The characteristic dimension for the inner shell 102 is less than 50, 40, 30, 20, 10, 5, 2, 1, 0.5 and 0.2 μm.

In some configurations, the outer shell 103 of the multi-compartment microcapsule 101 is configured to remain intact (e.g., not to rupture) when subjected to the particular stimulus. For example, the outer shell 103 may be made of a same material as that of the inner shell 102 but includes a thicker shell and thus the outer shell 103 withstands the particular stimulus while the inner shell 102 does not. A stimulus may include a mechanical force (e.g., a compressive force, compressive pressure), an electromagnetic force (e.g., application of a magnetic field), or another type of force. By applying the particular stimulus to the multi-compartment microcapsules 101, the first and second reactants 104, 105 can be mixed together to initiate the exothermic chemical reaction.

In an embodiment, the inner shells 102 and the outer shells 103 of the multi-compartment microcapsules 101 are each formed of or include one or more polymer layers. In the example illustrated in FIG. 1, the outer shell 103 encapsulates the inner shell 102. However, in other examples, such as the examples illustrated in FIG. 3, the second reactant 105 is encapsulated in a shell that does not encapsulate the inner shell 102.

Fabrication processes vary with the materials used to form the shells and with the reactants encapsulated by shells. A particular, non-limiting, example of a fabrication process includes in situ polymerization of urea-formaldehyde (UF) to form microcapsule shells around reactants. Microcapsule fabrication processes may include preparing an aqueous solution by mixing water and ethylene maleic anhydride (EMA) copolymer, and then agitating the aqueous solution. Urea, ammonium chloride, and resorcinol may be added to the aqueous solution.

As an example of a stimulus, a magnetic field may be used to rupture the inner shell 102 of the multi-compartment microcapsules 101. In terms of fabrication for the inner shell 102, functionalized magnetic nanoparticles may be added to the aqueous solution. The pH of the aqueous solution may be adjusted, e.g., by addition of sodium hydroxide (NaOH) or potassium hydroxide (KOH). The first reactant 104 may be added to the aqueous solution to form an emulsion. The first reactant 104 may be dissolved in a solvent for addition to the aqueous solution, or may be added in a solid form (e.g., powder, crystal granules).

Formaldehyde may be added to the emulsion to initiate a reaction to form urea-formaldehyde (UF) microcapsules (e.g., a first polymer layer encapsulating the first reactant 104). If functionalized magnetic nanoparticles are added to the aqueous solution, the functionalized magnetic nanoparticles may be covalently bonded to the UF microcapsules. After being formed, UF microcapsules may be cleaned, washed and dried. The UF microcapsules may be sieved to separate microcapsules that are not within a desired size range.

In the example above, the UF microcapsules encapsulating the first reactant 104 correspond to the inner shells 102 of FIG. 1. The outer shells 103 may be formed using a similar process. For example, the UF microcapsules encapsulating the first reactant 104 may be added to an emulsion that includes: (1) the second reactant 105 (in solution or solid form) and (2) reactants to form a second polymer layer (e.g., a second UF microcapsule encapsulating the second reactant 105). In the example illustrated in FIG. 1, the second polymer layer encapsulates the second reactant 105 and one or more UF microcapsules that encapsulate the first reactant 104. In other examples, the second polymer layer may intersect or couple to the first polymer layer, as in one or more of the examples illustrated in FIG. 3.

In general, for a given shell diameter, thinner shells rupture more readily than thicker shells made of a same material. The inner shell 102 may be made thinner than the outer shell 103. For example, an inner shell 102 having a first thickness of 1 μm is designed to rupture when exposed to a pressure of 1.4 psi that is less than a second pressure of 28.4 psi. The second pressure is a pressure at which an outer shell 103 is designed to rupture. In other embodiments, a magnitude of the second force or pressure is a substantial multiple of a magnitude of the first pressure. For example, the first pressure is 20 psi and the second pressure is 7,000 psi. An outer shell 103 having a second thickness (a thickness greater than the first thickness) ruptures when exposed to the second pressure. In the example where the inner shell 102 is made from a same material as the outer shell 103, the inner shells 102 are made relatively thin compared to the outer shells 103. In use, the inner shells 102 are ruptured while leaving the outer shells 103 intact. Rupturing the inner shells 102 allows a reaction to take place inside of the outer shells 103 without contaminating the material (e.g., laminate material, resin) with the reactants 104, 105.

In embodiments where the inner shells 102 include magnetic nanoparticles to facilitate rupturing of the inner shells 102, the magnetic nanoparticles may be covalently bound to the inner shells 102 of the multi-compartment microcapsules 101. Magnetic nanoparticles 203 are illustrated as the particles in the inner shells 202 in FIG. 2. Functionalized magnetic nanoparticles may be formed by reacting an organo trialkoxysilane, such as aminopropyltriethoxysilane, with a mild acid (e.g., acetic acid, hydrochloric acid, formic acid) in an aqueous solution to form a hydrolyzed silane. In addition to, or instead of water, a solvent, such as tetrahydrofuran, ethanol or methanol, may be used. Magnetic nanoparticles (e.g., $Fe_3O_4$) may be added to the solution after formation of the hydrolyzed silane to form functionalized magnetic nanoparticles. Rupturing the inner shell 102 causes the first reactant 104 to come into contact with the second reactant 105 thereby generating heat by an exothermic reaction. Heat from the microcapsule 101 is transferred to the composite material 107 through the outer shell 103.

In accordance with some embodiments, the first reactant 104 includes or corresponds to a reducing agent and the second reactant 105 corresponds to or includes an oxidizing agent. Alternately, the first reactant 104 includes or corresponds to an oxidizing agent and the second reactant 105 corresponds to or includes a reducing agent. These reactants are readily available and react predictably and quickly to generate a significant quantity of heat per unit weight. As an illustrative example, the first reactant 104 and second reactant 105 may include iron and oxygen, respectively. These materials react according to the following reaction equation:

$$4Fe(s)+3O_2(g)\Longrightarrow 2Fe_2O_3(s) \quad \Delta H_{rxn}=-1.65103 \text{ kJ}$$

In an embodiment, the first reactant 104 includes iron powder, and the second reactant 105 includes hydrogen peroxide ($H_2O_2$). The first reactant 104, the second reactant 105, or both, may also include a catalyst. A catalyst may be desired or may be necessary depending on the reactants and depending on the rate of desired heat generation from the microcapsules 101. For the example of iron powder and hydrogen peroxide, one catalyst could be ferric nitrate which, when in contact with hydrogen peroxide, liberates oxygen to react exothermically with the iron powder. In this example, the second reactant 105 may use 1.5 moles of hydrogen peroxide per mole of iron in the first reactant 104, or 0.56 grams of iron powder to 0.51 grams of hydrogen peroxide. The catalytic amount of ferric nitrate may be chosen to achieve a desired reaction rate and thereby a rate of heat generation. The reaction rate can be measured in units of Kilojoules per second or other suitable set of units.

Continuing this example, between 0.001 and 0.005 gram equivalents of ferric nitrate per liter of hydrogen peroxide results in a reaction rate producing heat at between 100 and 500 kJ/s. In some embodiments, other metals may be used in lieu of iron or in addition to iron. For example, magnesium or a magnesium-iron alloy may be used. In some embodiments, no catalyst is used where a catalyst is unnecessary either for the reaction to occur or to speed the rate of reaction. In this example, another catalyst could be used in lieu of, or in addition to, ferric nitrate, such as sodium iodide (NaI).

In the example illustrated in FIG. 1, the multi-compartment microcapsules 101 each include two reactants. However, in some embodiments, the multi-compartment microcapsules 101 each include more than two reactants so as to provide for a desired exothermic reaction and desired heat generation characteristics for the microcapsules 101. In such embodiments, the plurality of reactants remain separated in a plurality of compartments in the multi-compartment microcapsules 101 until the exothermic reaction is initiated by opening the compartments and allowing reactants to mix. For example, a multi-compartment microcapsule 101 includes a first compartment, a second compartment, and a third compartment, and so forth, and each compartment contains a different reactant. In some embodiments, the compartments may be in a shell-in-shell arrangement (e.g., in a nested arrangement), as illustrated in FIG. 1. Alternatively, a single outer shell may encapsulate each of the compartments, and the reactants may be separated by a plurality of inner membranes or barriers.

Production of multi-layer printed circuit boards provides an illustrative example of the benefits of use of the multi-compartment microcapsule 101. Multi-layer printed circuit boards may be produced by forming conductive layers (generally defining portions of circuits) on a substrate of a pre-preg material or a core laminate material. The pre-preg material may include fibers impregnated with an epoxy or other resin. An example of a pre-preg material used in the production of printed circuit boards is FR-4, which is made of woven fiberglass and a B-stage epoxy. Other common pre-preg materials include FR-5, FR-6, G-10, and G-11.

A printed circuit board may include several layers of pre-preg material, which may be cured via application of heat. Optionally, pressure may be applied contemporaneously with application of heat. To illustrate, the layers of pre-preg material may be placed between heated platens. The heated platens apply heat and pressure to the layers of pre-preg material to facilitate curing of the epoxy or other resin. In this arrangement, layers of pre-preg material adjacent to the platens usually are heated to a higher temperature than inner layers (e.g., middle layers of a stack of pre-preg materials), resulting in uneven heating of the various layers of the pre-preg material. The uneven heating can result in uneven curing of the epoxy or other resin between the various layers. Layers adjacent to the platen that receive more heat, may have higher levels of curing (e.g., more cross-linking, longer polymer chains) than layers that are not adjacent to the platen (e.g., middle layers).

The cure level of a layer may be correlated with one or more material properties or with one or more electrical properties. For example, layers that have higher levels of curing may have higher glass transition temperatures than layers with lower levels of curing. As another example, a coefficient of thermal expansion (CTE) of each layer may be correlated with the level of curing of the layer. As yet another example, a dielectric constant of the layers may be correlated with level of curing. Uneven heating can be avoided by using the multi-compartment microcapsules 101. Accordingly, undesired properties in the PCB layers are reduced or avoided by incorporating and using multi-compartment microcapsules 101 to generate heat during the curing process.

Referring again to FIG. 1, the multi-compartment microcapsules 101 are incorporated into the composite material 107. The composite material 107 is used to form the printed circuit board (PCB) 100. The composite material 107 may include or correspond to one or more layers of a pre-preg material. Only a single layer is shown for sake of simplicity of illustration in FIG. 1. When the layers of the pre-preg material are cured using heated platens, application of a stimulus (e.g., a force or pressure applied by the platens or application of a magnetic field) causes the inner shell 102 of at least some of the multi-compartment microcapsules 101 to rupture. The first and second reactants 104, 105 of the multi-compartment microcapsules 101 mix and react exothermically and thereby generate heat. Heat from the exothermic reaction passes to the outer shell 103 of the multi-compartment microcapsule 101 and the heat is conducted into the composite material 107. The heat helps maintain a more uniform temperature profile in the composite material 107, which promotes a more uniform cure of the composite material 107.

Figure 4:
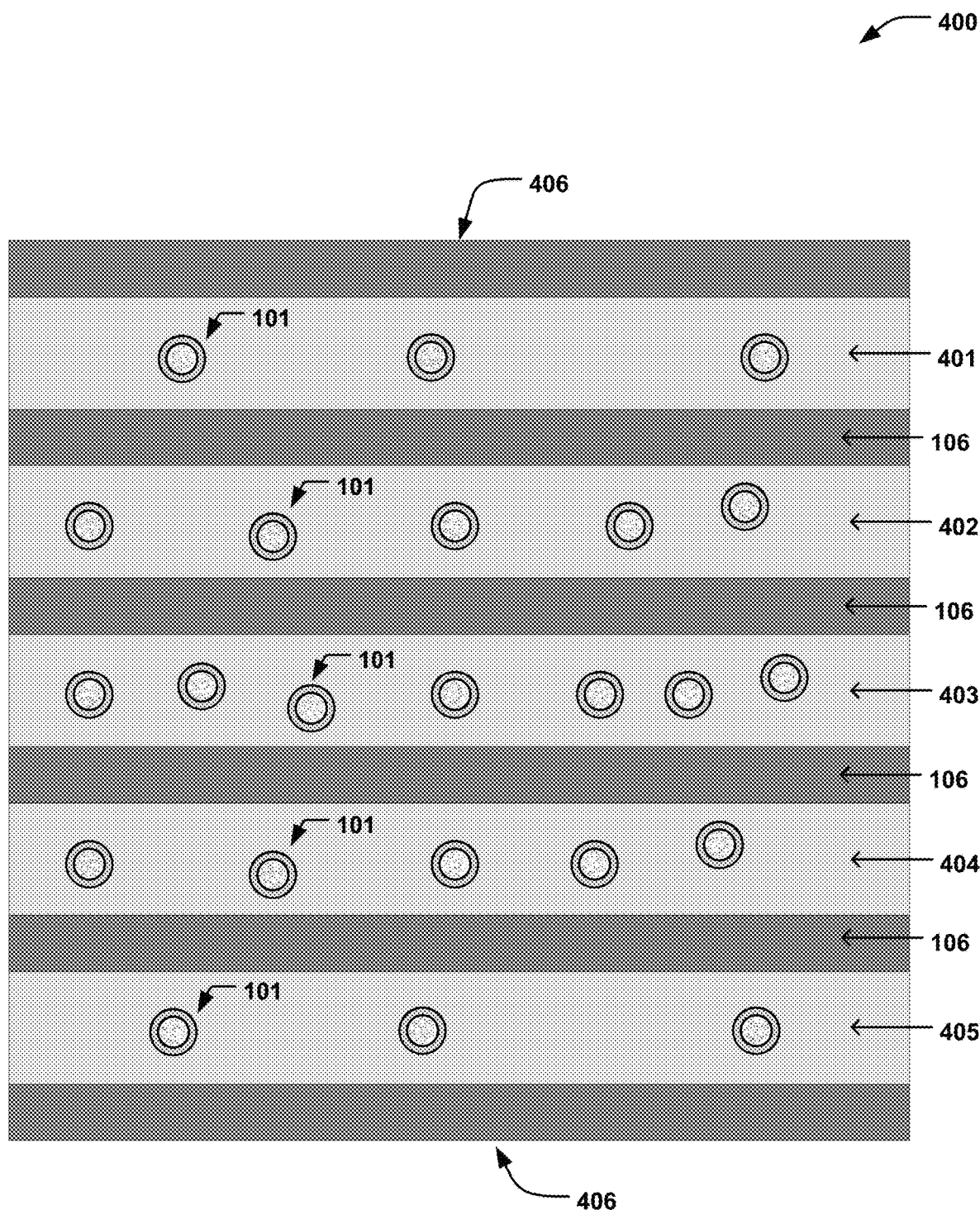
FIG. 4 depicts an embodiment of a portion of a PCB showing multiple layers of composite material, each layer including a different amount and density of multi-compartment microcapsules.

In some implementations, one layer of the pre-preg material may have a different amount or different concentration of the multi-compartment microcapsules 101 as compared to another layer of the pre-preg material. For example, layers of the pre-preg material that are closest to the platens during curing may have a lower concentration of the multi-compartment microcapsules 101 because these layers reach a higher temperature than inner layers during heating applied from the outside through heated platens. An example of multiple layers of pre-preg material is illustrated in FIG. 4.

Layers of the pre-preg material that are internal (e.g., further from the platens during curing) may be provided with a higher concentration of the multi-compartment microcapsules 101 in order to offset the temperature profile over time. That is, the inner layers are heated with microcapsules 101 while the outer layers are heated predominantly with application of the platens. In this example, the multi-compartment microcapsules 101 in the internal layers generate more heat per unit mass of pre-preg material because the microcapsules 101 are found in a larger amount or in a higher concentration than in the external layers. Thus, increased heat generation from the exothermic reaction of the first and second reactants 104, 105 helps to offset or nearly offsets a thermal or temperature gradient at any instant of time. A conventional thermal gradient is undesirable and is due to the uneven application of heat to the external layers by hot platens.

In some implementations, multi-compartment microcapsules 101 having different rupture characteristics or different exothermic reaction characteristics may be used. For example, the curing process may be performed in sequential stages in a heated press in which applied pressure and applied temperature may vary in each stage. In this example, a first set of the multi-compartment microcapsules 101 has a first rupture characteristic, and a second set of the multi-compartment microcapsules 101 has a second, different rupture characteristic. Both the first set and second set of microcapsules are included in the same layer or layers. The first rupture characteristic causes the inner shells 102 of the first set of multi-compartment microcapsules 101 to rupture during a first stage of the curing process. The second rupture characteristic causes the inner shells 102 of the second set of multi-compartment microcapsules 101 to rupture during a second stage of the curing process. In this example, both stages are necessary for curing.

To illustrate, the inner shells 102 of the first set of multi-compartment microcapsules 101 have a first wall thickness, and the inner shells 102 of the second set of multi-compartment microcapsules 101 have a second wall thickness different from the first wall thickness. The first wall thickness is configured or selected to rupture at a first pressure, and the second wall thickness is configured or selected to rupture at a second pressure greater than the first pressure. The first pressure may correspond to a pressure applied by the heated press during the first stage of the curing process. The second pressure may correspond to the pressure applied by the heated press during the second stage of the curing process. Thus, by using different wall thicknesses of the inner shell 102—and thereby forming two types of multi-compartment microcapsules 101—the pressure at which the inner shell 102 ruptures can be chosen so that the exothermic reaction between the first reactant 104 and second reactant 105 is triggered during a specific stage of various sequential stages of the curing process.

In this example, the compressive force or pressure applied to the PCB 100 by the heated press may be within a first range that is typical for manufacture of PCBs. The inner shell 102 of the multi-compartment microcapsule 101 is configured to sustain, without rupturing, a pressure less than a lower bound of the first range but ruptures at pressures within the first range of pressures. In contrast, the outer shell 103 of the multi-compartment microcapsule 101 is configured to sustain, without rupturing, a pressure less than an upper bound of the first range. In one embodiment, the first range is from about 450 psi to about 600 psi.

Multi-compartment microcapsules 101 may be designed to work via one or more various rupture mechanisms. To illustrate, a first set of multi-compartment microcapsules 101 may be configured to rupture when subjected to a magnetic field, while a second set of the multi-compartment microcapsules 101 may be configured to rupture when subjected to a mechanical force (e.g., a compressive force, compressive pressure).

Figure 2:
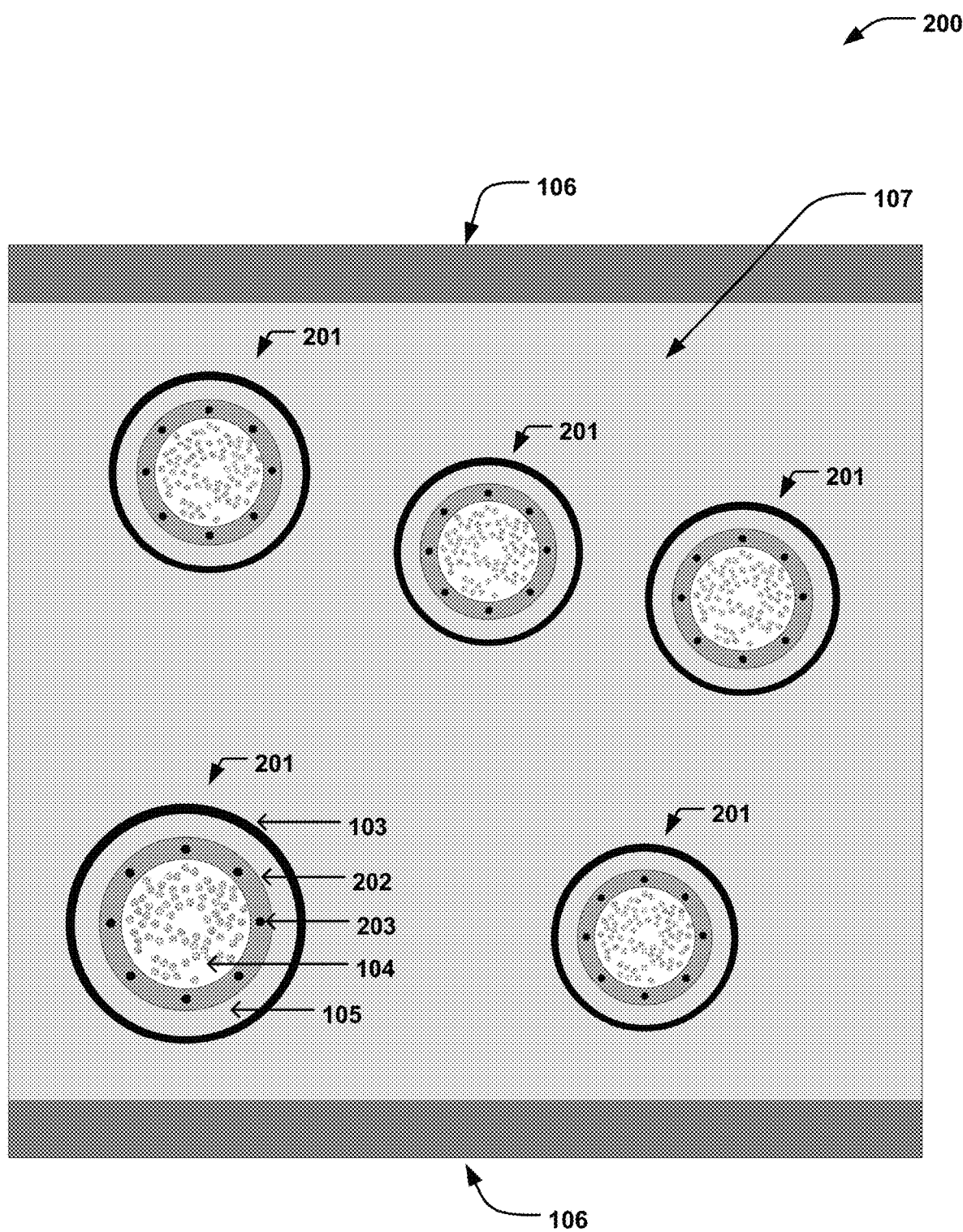
FIG. 2 depicts an embodiment of a portion of a PCB that includes another type of multi-compartment microcapsule.

FIG. 2 depicts a cut-away view of another embodiment of a portion of a printed circuit board (PCB) 200. In FIG. 2, the multi-compartment microcapsules 201 have a shell-in-shell configuration with an inner shell 202 contained within an outer shell 103. In FIG. 2, the inner shell 202 is configured to rupture in response to application of a magnetic field. For example, a plurality of magnetic nanoparticles 203 are incorporated into the inner shell 202 of the multi-compartment microcapsule 201. The magnetic nanoparticles 203 may include, for example, magnetite ($Fe_3O_4$) or cobalt ferrite ($CoFe_2O_4$). The magnetic nanoparticles 203 may have a characteristic dimension (such as an average or maximum diameter) in a range from about 6 nanometers (nm) to about 25 nm.

Application of a magnetic field of sufficient strength ruptures the inner shell 202. The outer shell 103 of the multi-compartment microcapsule 201 does not include the magnetic nanoparticles 203 (or includes fewer of the magnetic nanoparticles 203). In an alternative embodiment, the outer shell 103 does not include the magnetic nanoparticles 203 and is thicker than the inner shell 202. Accordingly, the outer shell 103 is configured to remain intact when the multi-compartment microcapsule 201 is exposed to a magnetic field. In a particular example, application of a sufficiently strong time-varying magnetic field to the PCB 200 causes the magnetic nanoparticles 203 to rotate and/or vibrate resulting in rupture of the inner shell 202. In some examples, the time-varying magnetic field has a frequency in a range from about 50 kHz to about 100 kHz and a strength in a range from about 2 kA/m to about 3 kA/m. Other ranges and strengths are possible and are matched to one or more characteristics of the nanoparticles 203, the inner shell 202, or the combination of nanoparticles 203 and inner shell 202.

Rupturing the inner shell 202 causes the first reactant 104 to come into contact with the second reactant 105. Mixing of the reactants 104, 105 allows the exothermic reaction to proceed and thereby generate heat for curing of the composite material 107. In a particular embodiment, the reaction is exothermic and generates heat, as described with reference to FIG. 1. Other types of useful reactions are possible. In the case described above, a thermal gradient formed in the PCB 200 can be changed to overcome side effects of application of heat from a heat platen pressed to the outside surfaces of the PCB 200. That is, a conventional thermal gradient can be counteracted with use of multi-compartment microcapsules 201 and triggering of an available exothermic reaction occurring inside of the composite material 107.

Figure 3:
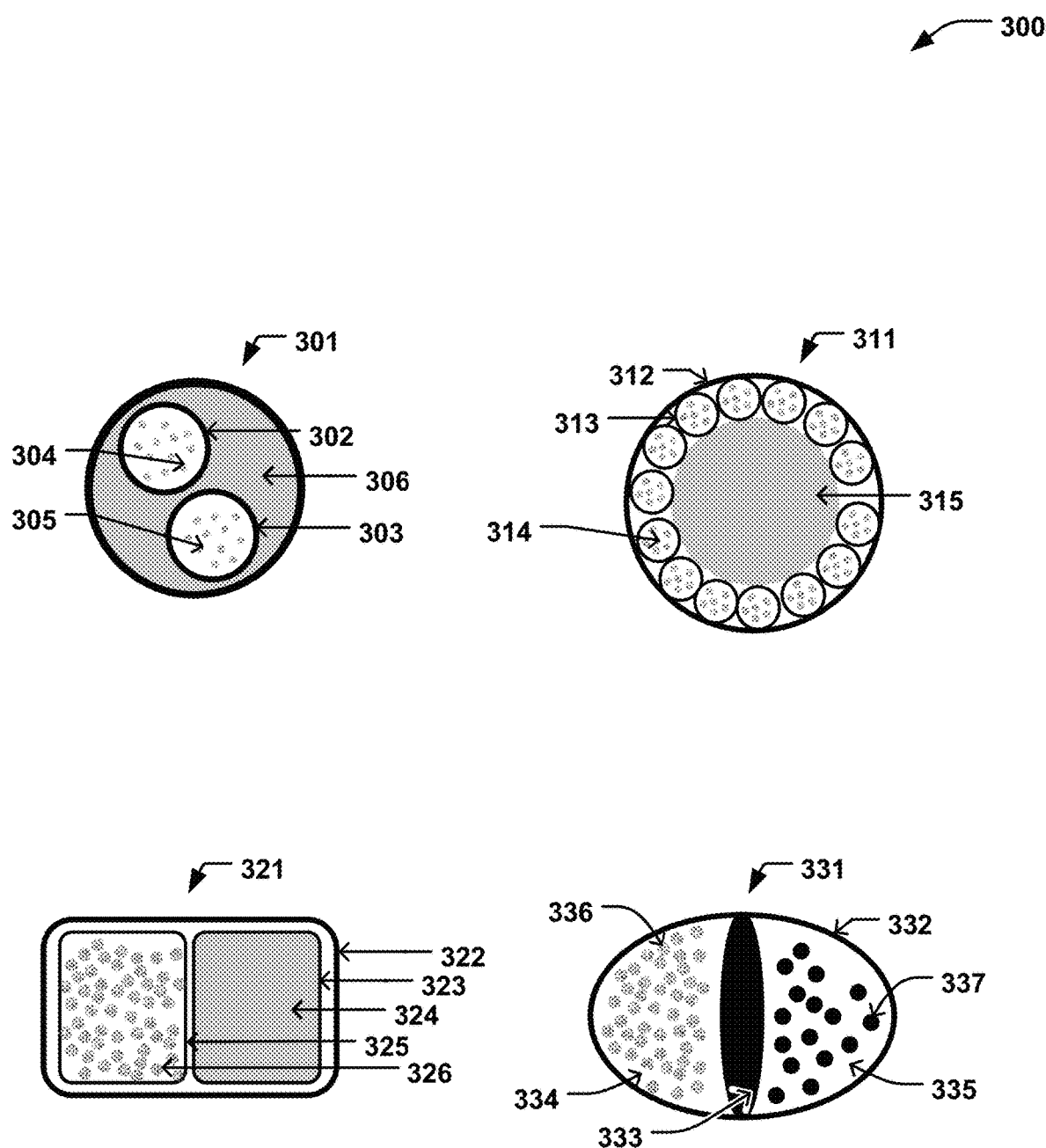
FIG. 3 illustrates various embodiments of multi-compartment microcapsules.

FIG. 3 illustrates several cross-sectional views of other embodiments of multi-compartment microcapsules. A first multi-compartment microcapsule 301 of FIG. 3 illustrates an example of a multi-compartment microcapsule that includes more than two reactants. The first multi-compartment microcapsule 301 has a shell-in-shell architecture with two inner shells 302, 303, each with respective contents 304, 305. The first content 304 includes a first reactant, and the second content 305 includes a second reactant. In other examples, the first and second contents 304, 305 may both include the first reactant. A remaining volume inside an outer shell of the first multi-compartment microcapsule 301 may include a third reactant 306. The inner shells 302, 303, when unruptured, isolate the contents 304, 305 from each other and from the third reactant 306. In some embodiments, the respective inner shells 302, 303 may be configured to rupture responsive to different stimuli. For example, the first inner shell 302 may be configured to rupture responsive to a first force (which may be mechanical or magnetic), and the second inner shell 303 may be configured to rupture responsive to a second force (which may be mechanical or magnetic). In this example, the first force may be of the same type (e.g., mechanical or magnetic) as the second compressive force, or the first and second forces may be of different types (e.g., the first may be mechanical and the second may be magnetic).

A second multi-compartment microcapsule 311 of FIG. 3 includes an outer shell 312 and a set of inner shells 313 within the outer shell 312. Each of the inner shells 313 contains a reactant 314. The thickness of the inner shells 313 may be thinner than the thickness of the outer shell 312. When one or more of the inner shells 313 rupture, the reactant 314 may be exposed to a solid inner core 315 which is a second reactant. Alternatively, the inner core 315 may be liquid, a gel or a colloid suspension.

A third multi-compartment microcapsule 321 of FIG. 3 includes an outer shell 322 which encloses two inner shells 323, 325. A first inner shell 323 contains a first reactant, and a second inner shell 325 contains a second reactant. A space between the outer shell 322 and the inner shells 323, 325 of the third multi-compartment microcapsule 321 does not include a reactant while the inner shells 323, 325 are intact (e.g., unruptured). Both of the inner shells 323, 325 rupture in response to a stimulus that, in turn, allows the first reactant 324 to mix with, and exothermically react with, the second reactant 326. The inner shells 323, 325 may rupture responsive to the same stimulus, or in response to different stimuli. To illustrate, both of the inner shells 323, 325 may rupture when a sufficient compressive force is applied to the third multi-compartment microcapsule 321. As another illustrative example, the first inner shell 323 may rupture when a magnetic field is applied to the third multi-compartment microcapsule 321, and the second inner shell 325 may rupture when a sufficient compressive force is applied to the third multi-compartment microcapsule 321.

A fourth multi-compartment microcapsule 331 of FIG. 3 includes an outer shell 332 and an inner membrane 333. The membrane 333 may be configured to rupture responsive to a stimulus. When the membrane 333 ruptures, contents of a first compartment 334 are allowed to mix with contents of a second compartment 335. The contents of the first compartment 334 includes a first reactant 336, and the contents of the second compartment 335 includes a second reactant 337.

FIG. 3 illustrates some variations of embodiments of multi-reactant microcapsules. According to some embodiments, a sequence of stimuli is needed to mix reactants. By sequential application of specific types of stimuli, a sequence of reactions may be performed in order to sustain heat generation over time or to alter the progression of a heat profile over time or to meet some other design goal such as to halt a reaction at a certain point or when a material reaches a certain temperature. Alternatively, sequential application of different stimuli may correspond to taking steps needed to initiate a single reaction requiring multiple reactants to be added in a particular order.

In the case of a compressive force, there are various mechanisms for rupturing a first or inner compartment and not a second or outer compartment of a multi-compartment microcapsule. For example, an inner capsule may be made of a relatively brittle material. The inner capsule or shell is broken by application of an external pressure. The external pressure causes small, uneven sheer forces in the inner shell wall sufficient to rupture it and not rupture an outer shell wall. The outer shell wall remains intact for one or more reasons. The inner shell and outer shell can be made of a same or different material but can be made of different thicknesses. Sheer forces due to application of a compressive force to the laminate are not sufficient to break a thicker outer shell wall. Alternatively, an inner shell may be made of a brittle material and the outer shell wall may be made of a resilient material. The inner shell wall ruptures when exposed to a first pressure due to uneven sheer forces developed in the inner brittle shell wall. The outer shell is able to flex and resist the same uneven sheer forces.

Another mechanism to rupture an inner shell is the application of heat where the inner shell undergoes a phase change from solid to liquid at a particular temperature or sufficiently softens that perforations or tears appear in the inner shell wall. For this mechanism, an example of a stimulus is application of microwave energy to the microcapsules 101. The inner shell 102 reaches a softening point sooner than a softening point of the outer shell 103. According to one example, the inner shell is made of a material with a lower softening temperature than the material used for the outer shell. The inner shell material may be made of a cured resin that contains a thermoplastic resin with a low thermal resistance.

In some implementations, the microcapsules are designed to be activated by a combination of stimuli, either in combination or in sequence. For example, a compressive force is applied simultaneously with a magnetic field. The magnetic field lowers the rupture strength of the inner shell 102 such that a small amount of compressive force completes the formation of openings in the inner shell wall. As another example, heat and a compressive force may be simultaneously or sequentially applied to the microcapsules 101. The heat raises the temperature of the inner shell 102 to a point where application of a compressive force is able to rupture the inner shell 102 while allowing the outer shell 103 to remain intact.

FIG. 4 depicts a multi-layer printed circuit board (PCB) 400 including layers of conductive material 106 separated by respective layers of composite material such as composite material layers 401, 402, 403, 404, 405 according to an illustrative example. The multi-layer PCB 400 is an example of an article of manufacture. Each of the composite material layers 401-405 contains multi-compartment microcapsules 101. Each of the composite material layers 401-405 corresponds to a layer of the composite material 107 of FIG. 1 or FIG. 2. The multi-layer PCB 400 may also include outer layers of a conductive material 406.

In FIG. 4, the number or concentration of multi-compartment microcapsules 101 included in each composite material layer 401, 402, 403, 404, 405 varies according to the location of the layer in the multi-layer printed circuit board 400 in a vertical dimension. Specifically, the outer layers 401, 405 have a lower concentration or amount of multi-compartment microcapsules 101 than each of the respective inner layers 402-404. The inner-most layer 403 has a higher concentration or amount of multi-compartment microcapsules 101 than inner layers 402, 404.

During a curing process, outermost composite material layers 401, 405 proximate to the outermost layers of conductive material 406 may receive more heat from an external source (e.g., a heated platen) than does an innermost composite material layer 403 of the multi-layer PCB 400 because the heat from the external source is applied from the top and bottom. That is, the outermost composite material layers 401, 405 experience a higher temperature than the other layers 402-404. Thus, as illustrated in FIG. 4, the innermost composite material layer 403 includes a greater number (e.g., greater concentration, greater overall amount) of multi-compartment microcapsules 101 than the composite material layers 401, 402, 404, 405 closer to the outermost layers of conductive material 406 in the multi-layer PCB 400 (with thickness of composite material layer held constant).

When activated (e.g., by rupturing the inner shell of each), the greater amount of multi-compartment microcapsules 101 of the innermost composite material layer 403 generate more heat per unit of composite material than the lesser amounts of multi-compartment microcapsules 101 of the other composite material layers 401, 402, 404, 405. By generating more heat via chemical reaction of the multi-compartment microcapsules 101, a temperature profile of the printed circuit board 400 during the curing process may be made more uniform as observed from top to bottom in the PCB 400. The increased heat generated by the multi-compartment microcapsules 101 of the innermost composite material layer 403 compensates for the conventional thermal gradient that would normally develop due to application of heat at the outer layers of conductive material 406. Improved curing results from the improved temperature or thermal gradient.

In some implementations, the amount or concentration of multi-compartment microcapsules 101 in one or more of the other layers (e.g., composite material layers 401, 402, 404, 405) may be related to a distance of the layer from the outer layers 406 where heat is applied. The specific amount or concentration of the multi-compartment microcapsules 101 to be added to each layer may be determined as a function of certain factors such as: the heat generated by each of the multi-compartment microcapsule 101, thickness of each layer, the amount of pressure required to rupture the inner shell 102 of a multi-compartment microcapsule 101, and the temperature profile or the thermal gradient in the multi-layer PCB 400.

Additionally, or in the alternative to varying the amount or concentration of the multi-compartment microcapsule 101 based on the distance of each layer from an external heat source, different types of multi-compartment microcapsule 101 may be used for different layers. For example, the multi-compartment microcapsule 101 of the innermost composite material layer 403 may include a first set of reactants (or a first quantity of reactants) configured to generate a first quantity of heat upon reaction. In this example, one or more of the composite material layers 401, 402, 404, 405 may include multi-compartment microcapsule 101 that include a second and different set of reactants configured to generate a different quantity of heat upon reaction.

Alternatively, according to another embodiment, the multi-compartment microcapsules 101 include a different quantity of the same reactants or a different concentration of same reactants in a same or similar volume of microcapsule 101. The multi-compartment microcapsules 101 of the innermost composite material layer 403 are configured to generate more heat (per multi-compartment microcapsule 101) than the multi-compartment microcapsules 101 of one or more of the composite material layers 401, 402, 404, 405. The microcapsules 101 of the composite material layers 402, 404 generate more heat than the outermost layers 401, 405.

Figure 5:
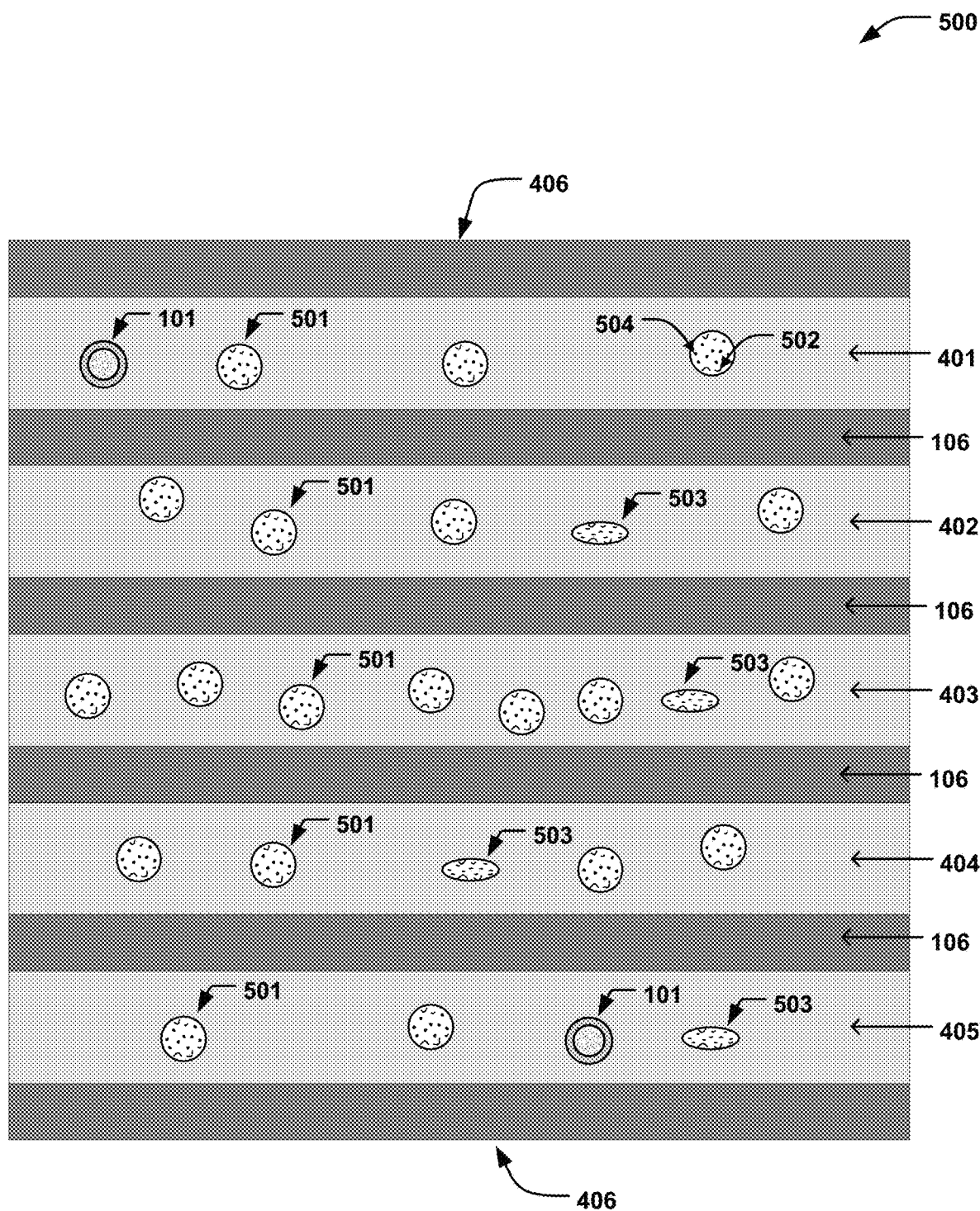
FIG. 5 depicts the portion of the PCB illustrated in FIG. 4 showing multiple layers of composite material after reaction of the contents of the multi-compartment microcapsules.

FIG. 5 depicts the portion of the PCB illustrated in FIG. 4 showing multiple layers of composite material and microcapsules 501 according to one embodiment of a cured multi-layer PCB 500. The microcapsules 501 are spent multi-compartment microcapsules because the reactants (e.g., the reactants 104, 105 of FIG. 1) have reacted with each other. In this embodiment, the outer shell (e.g., the outer shell 103) remains intact. The inner shell has been ruptured and pieces 502 of the former inner shell are inside the spent microcapsules 501. Reaction end products 504 are also inside the microcapsules 501. The PCB 500 may also include some unspent multi-compartment microcapsules 101. Alternatively, all of the microcapsules 501 in the PCB 500 are spent.

The cured multi-layer PCB 500 includes layers of conductive material 106 separated by respective layers of composite material, such as composite material layers 401, 402, 403, 404, 405. The multi-layer PCB 500 is an example of an article of manufacture. Each of the composite material layers 401-405 contains spent microcapsules 501, 503 and may include one or more unspent multi-compartment microcapsules 101. Each of the composite material layers 401-405 corresponds to a layer of the composite material 107 of FIG. 1 or FIG. 2. The multi-layer PCB 500 may also include layers of a conductive material 406.

In FIG. 5, the number or concentration of spent microcapsules 501 included in each composite material layer 401, 402, 403, 404, 405 varies according to the location of the layer in the multi-layer printed circuit board 500 in a vertical dimension. The outer layers 401, 405 have a lower concentration or amount of microcapsules 501 than each of the respective inner layers 402-404. The inner-most layer 403 has a higher concentration or amount of spent microcapsules 501 than inner layers 402, 404.

When a cured multi-layer PCB 500 is inspected, the presence of the spent microcapsules 501 having reaction end products 504 is one indication that multi-compartment microcapsules 101 were present and were activated during curing of the PCB 500. The presence of pieces of inner shell 502 and the reaction end products 504 inside of a spent microcapsule 501 is another indication that multi-compartment microcapsules 101 were present and were activated. For an embodiment of a microcapsule having an isolating structure (such as membrane 333 illustrated in FIG. 3), instead of pieces of inner shell 502, the isolating structure or portions thereof may be found in a spent microcapsule 501.

According to an alternative embodiment, during curing, some of the spent microcapsules 501 deform and appear in the cured multi-layer PCB 500 as deformed microcapsules 503. That is, when exposed to pressure and heat, such as the heat generated from an exothermic reaction in the microcapsules 101, the outer shells of spent microcapsules 501 softened and deformed, but remained intact as illustrated in FIG. 5 as deformed microcapsules 503.

According to yet another alternative embodiment, the outer shell of a spent microcapsule 501 does not remain intact during a curing process. Instead, pieces of inner shell 502, pieces of outer shell, and reaction end products 504 are found in pockets in one or more layers of composite material 401-405.

Figure 6:
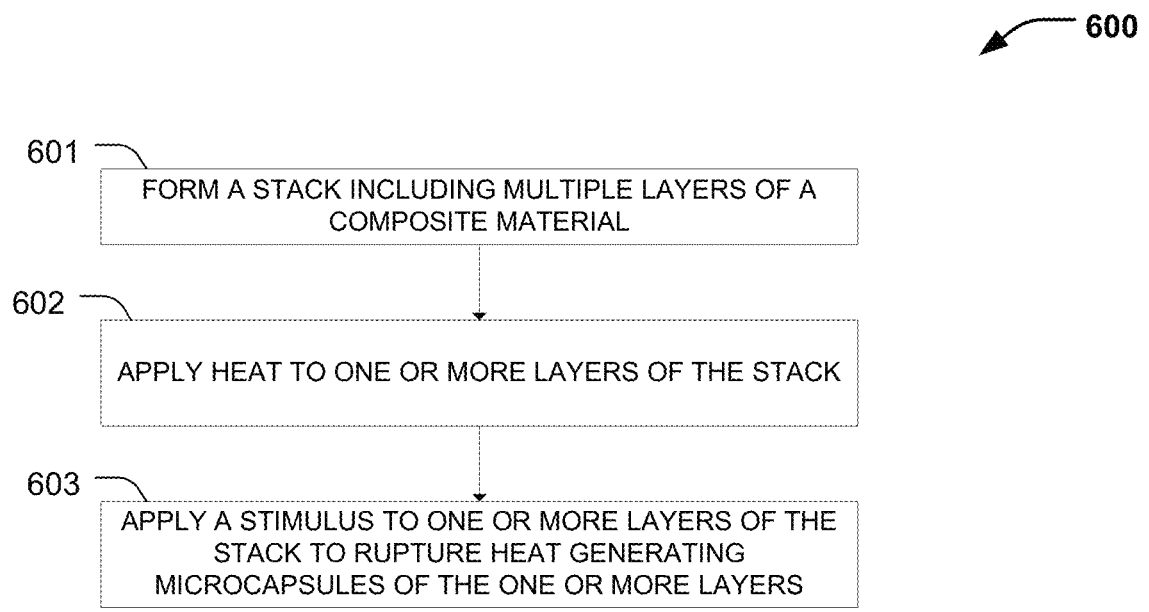
FIG. 6 is a flow diagram showing a particular embodiment of a process to cure a self-heating composite material.

FIG. 6 is a flow diagram showing a particular embodiment of a method 600 to cure a composite material. The method 600 includes, at 601, forming a stack including multiple layers of a composite material. For example, the stack may include or correspond to the multi-layer printed circuit board 400 of FIG. 4. The PCB 400 includes layers of conductive material 106 and composite material layers 401-405. In other examples, the stack may include more layers, fewer layers, different types of layers, or a different arrangement of layers. The layers may be uniform or non-uniform in thickness along its width or length, and each layer may be of a different thickness as compared to other layers. One or more of the layers of composite material may include a pre-preg material, such as a resin embedded in or coupled to fiberglass. Additionally, one or more of the layers of composite material may include multi-compartment microcapsules, such as the multi-compartment microcapsules 101, the multi-compartment microcapsules 201, the multi-compartment microcapsules 301, 311, 321, 331, or a combination thereof.

The method 600 also includes, at 602, applying heat to one to more layers of the stack.

For example, the stack may be placed between platens of a press. The press may apply heat and pressure to the stack to effect curing of the composite material. In this example, generally, the heat is applied via conduction from the top platen to a top layer of the stack, from the bottom platen to a bottom layer of the stack, or both. Thus, a temperature gradient in the stack may be such that inner layers of the stack are cooler than outer layers of the stack at any given instant of time.

The method 600 also includes, at 603, applying a stimulus to one or more layers of the stack to rupture one or more heat generating microcapsules of the one or more layers. For example, the stimulus may include or correspond to the pressure applied by the press. To illustrate, the press may apply a force to the stack that is greater than or equal to a rupture threshold of a barrier layer of one or more of the microcapsules. The barrier layer may separate reactants within the microcapsules. Rupturing the barrier layer allows the reactants to mix and undergo an exothermic chemical reaction. As another example, the stimulus may include or correspond to a magnetic field. To illustrate, the press may apply a time varying magnetic field that is sufficient to cause magnetic particles bonded to the barrier layers of one or more of the microcapsules to rupture. The barrier layers may include or correspond to the inner shells 102 of FIG. 1, the inner shells 202 of FIG. 2, one or more of the inner shells 302, 303, 313, 323, 325 of FIG. 3, the inner membrane 333 of FIG. 3, or a combination thereof.

Heat released as a result of the exothermic chemical reaction may increase a temperature of one or more layers of the stack. To illustrate, the temperature of one or more inner layers of the stack may be increased in order to decrease a temperature gradient of the stack. By decreasing the temperature gradient of the stack, the heat of the exothermic chemical reaction may facilitate uniform curing of the composite material or increased uniformity of curing of the composite material.

In some embodiments, the method 600 may include application of stimuli in stages. For example, after applying the stimulus at 603, a different or additional stimulus may be applied to rupture additional barrier layers of other microcapsules. Thus, heat generated due to exothermic reaction of reactants in the microcapsules of the stack may be released in stages to control or regulate a temperature within the stack over time to thereby shape a temperature gradient of the stack over time to facilitate uniform curing of the composite material of the stack.

An apparatus, comprising:
  a cured composite material, comprising:
    a first layer; and
    a second layer coupled to the first layer, wherein the second layer includes microcapsules, and wherein each microcapsule includes an outer shell containing a reaction end product and a portion of an isolating structure.

The apparatus of claim 1, wherein the first layer includes microcapsules, and wherein the microcapsules in the first layer are included at a higher density per unit volume of cured composite material than a density of microcapsules included in the second layer.

The apparatus of claim 1, wherein the cured composite material includes one or more of an adhesive and an epoxy resin.

The apparatus of claim 1, wherein at least some of the microcapsules of the second layer include a catalyst for a reaction yielding the reaction end product.

The apparatus of claim 1, wherein the isolating structure includes a piece of an inner shell, and wherein the isolating structure is made of a same material as the outer shell.

The apparatus of claim 1, further comprising a conductive layer coupled to the first layer, the second layer, or a combination thereof.

The apparatus of claim 1, wherein the microcapsules comprise:
  a first shell encapsulating a first reactant; and
  a second shell encapsulating a second reactant, wherein the first shell encapsulates the second shell, and wherein the first shell is configured to remain intact in response to a stimulus strong enough to rupture the second shell.

The apparatus of claim 7, wherein the first reactant comprises a metal, a reducing agent, or a combination thereof.

The apparatus of claim 7, wherein the first reactant comprises a catalyst, ferric nitrate, sodium iodide, or a combination thereof.

The apparatus of claim 7, wherein the second reactant comprises an oxidizing agent, water, hydrogen peroxide, or a combination thereof.

The apparatus of claim 7, wherein the second shell of the microcapsules further includes magnetic nanoparticles embedded therein.

The apparatus of claim 11, wherein the magnetic nanoparticles comprise magnetite, cobalt ferrite, or a combination thereof.

An apparatus, comprising:
  a cured composite material, comprising:
    a first layer; and
    a second layer coupled to the first layer, wherein the second layer includes microcapsules, wherein each microcapsule includes an outer shell containing a reaction end product and a portion of an isolating structure, and wherein the microcapsules comprise:
a first shell encapsulating a first reactant; and
a second shell encapsulating a second reactant, wherein the first shell encapsulates the second shell, and wherein the first shell is configured to remain intact in response to a stimulus strong enough to rupture the second shell.

The apparatus of claim 13, wherein the cured composite material includes one or more of an adhesive and an epoxy resin.

The apparatus of claim 13, wherein at least some of the microcapsules of the second layer include a catalyst for a reaction yielding the reaction end product.

The apparatus of claim 13, wherein the first reactant comprises a metal, a reducing agent, or a combination thereof.

The apparatus of claim 13, wherein the first reactant comprises a catalyst, ferric nitrate, sodium iodide, or a combination thereof.

The apparatus of claim 13, wherein the second reactant comprises an oxidizing agent, water, hydrogen peroxide, or a combination thereof.

The apparatus of claim 13, wherein the second shell of the microcapsules further includes magnetic nanoparticles embedded therein.

An apparatus, comprising:
a cured composite material, comprising:
a first layer; and
a second layer coupled to the first layer, wherein the second layer includes microcapsules, wherein each microcapsule includes an outer shell containing a reaction end product and a portion of an isolating structure, and wherein the microcapsules comprise:
a first shell encapsulating a first reactant, the first reactant comprising a metal, a reducing agent, or a combination thereof; and
a second shell encapsulating a second reactant, wherein the first shell encapsulates the second shell, and wherein the first shell is configured to remain intact in response to a stimulus strong enough to rupture the second shell.

The previous description of the disclosed embodiments is provided to enable any person skilled in the art to make or use the disclosed embodiments. Various modifications to these embodiments will be readily apparent to those skilled in the art, and the generic principles defined herein may be applied to other embodiments without departing from the scope of the disclosure. Thus, the present disclosure is not intended to be limited to the embodiments shown herein but is to be accorded the widest scope possible consistent with the principles and features as defined by the following claims.

The invention claimed is:

1. An article of manufacture, comprising:
a cured composite material, comprising:
a first layer that includes a first plurality of ruptured microcapsules; and
a second layer coupled to the first layer, wherein the second layer including a second plurality of microcapsules, and wherein at least one of the microcapsules of the second plurality of microcapsules includes an outer shell containing a reaction end product and a portion of an isolating structure.

2. The article of manufacture of claim 1, and wherein the first plurality of microcapsules in the first layer are included at a higher density per unit volume of cured composite material than a density of the second plurality of microcapsules included in the second layer.

3. The article of manufacture of claim 1, wherein the cured composite material includes one or more of an adhesive and an epoxy resin.

4. The article of manufacture of claim 1, wherein at least some of the microcapsules of the second layer include a catalyst for a reaction yielding the reaction end product.

5. The article of manufacture of claim 1, wherein the isolating structure includes a piece of an inner shell, and wherein the isolating structure is made of a same material as the outer shell.

6. The article of manufacture of claim 1, further comprising a conductive layer coupled to the first layer, the second layer, or a combination thereof.

7. The article of manufacture of claim 1, wherein the second plurality of microcapsules comprises spent microcapsules and unspent microcapsules, the unspent microcapsules comprising:
a first shell encapsulating a first reactant; and
a second shell encapsulating a second reactant, wherein the first shell encapsulates the second shell, and wherein the first shell is configured to remain intact in response to a stimulus strong enough to rupture the second shell.

8. The article of manufacture of claim 7, wherein the first reactant comprises a metal, a reducing agent, or a combination thereof.

9. The article of manufacture of claim 7, wherein the first reactant comprises a catalyst, ferric nitrate, sodium iodide, or a combination thereof.

10. The article of manufacture of claim 7, wherein the second reactant comprises an oxidizing agent, water, hydrogen peroxide, or a combination thereof.

11. The article of manufacture of claim 7, wherein the second shell of the microcapsules further includes magnetic nanoparticles embedded therein.

12. The article of manufacture of claim 11, wherein the magnetic nanoparticles comprise magnetite, cobalt ferrite, or a combination thereof.

13. An article of manufacture, comprising:
a cured composite material, comprising:
a first layer that includes a first plurality of spent microcapsules; and
a second layer coupled to the first layer, wherein the second layer includes a second plurality of microcapsules, the second plurality of microcapsules comprising spent microcapsules and unspent microcapsules wherein at least one of the spent microcapsules includes an outer shell containing a reaction end product and a portion of an isolating structure, and wherein the first plurality of spent microcapsules and the spent microcapsules of the second plurality of microcapsules are derived from microcapsules comprising:
a first shell encapsulating a first reactant; and
a second shell encapsulating a second reactant, wherein the first shell encapsulates the second shell, and wherein the first shell is configured to remain intact in response to a stimulus strong enough to rupture the second shell.

14. The article of manufacture of claim 13, wherein the cured composite material includes one or more of an adhesive and an epoxy resin.

15. The article of manufacture of claim 13, wherein at least some of the microcapsules of the second layer include a catalyst for a reaction yielding the reaction end product.

16. The article of manufacture of claim 13, wherein the first reactant comprises a metal, a reducing agent, or a combination thereof.

17. The article of manufacture of claim 13, wherein the first reactant comprises a catalyst, ferric nitrate, sodium iodide, or a combination thereof.

18. The article of manufacture of claim 13, wherein the second reactant comprises an oxidizing agent, water, hydrogen peroxide, or a combination thereof.

19. The article of manufacture of claim 13, wherein the second shell of the microcapsules further includes magnetic nanoparticles embedded therein.

20. An article of manufacture, comprising:
a cured composite material, comprising:
a first layer; and
a second layer coupled to the first layer, wherein the second layer includes spent microcapsules, wherein each spent microcapsule includes an outer shell containing a reaction end product and a portion of an isolating structure, and wherein the spent microcapsules comprise:
a first shell encapsulating a first reactant, the first reactant comprising a metal, a reducing agent, or a combination thereof; and
a second shell encapsulating a second reactant, wherein the first shell encapsulates the second shell, and wherein the first shell is configured to remain intact in response to a stimulus strong enough to rupture the second shell.

* * * * *